US012568686B2

(12) United States Patent
Zhao et al.

(10) Patent No.:  US 12,568,686 B2
(45) Date of Patent:       Mar. 3, 2026

(54) ARRAY SUBSTRATE AND FABRICATION METHOD THEREOF, AND DISPLAY DEVICE

(71) Applicant: Shenzhen China Star Optoelectronics Semiconductor Display Technology Co., Ltd., Shenzhen (CN)

(72) Inventors: Bin Zhao, Shenzhen (CN); Xin Zhang, Shenzhen (CN); Juncheng Xiao, Shenzhen (CN); Dan Cao, Shenzhen (CN); Junling Liu, Shenzhen (CN); Xiaobo Hu, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 1400 days.

(21) Appl. No.: 16/964,203

(22) PCT Filed: May 15, 2020

(86) PCT No.: PCT/CN2020/090401
§ 371 (c)(1),
(2) Date: Jul. 23, 2020

(87) PCT Pub. No.: WO2021/212579
PCT Pub. Date: Oct. 28, 2021

(65) Prior Publication Data
US 2023/0154932 A1      May 18, 2023

(30) Foreign Application Priority Data

Apr. 23, 2020    (CN) .......................... 202010329059.0

(51) Int. Cl.
*H10D 86/60*          (2025.01)
*H01L 25/16*          (2023.01)
(Continued)

(52) U.S. Cl.
CPC ........... *H10D 86/60* (2025.01); *H01L 25/167* (2013.01); *H10D 86/0231* (2025.01); *H10D 86/441* (2025.01)

(58) Field of Classification Search
CPC . H01L 27/124; H01L 25/167; H01L 27/1288; H01L 29/66765; H01L 29/78678;
(Continued)

(56) References Cited

U.S. PATENT DOCUMENTS 6,038,003 A * 3/2000 Kim ...................... G02F 1/1345
                                                438/30
6,429,916 B1 * 8/2002 Nakata .............. G02F 1/136227
                                                349/110
(Continued)

*Primary Examiner* — Samuel A Gebremariam
*Assistant Examiner* — Jonas T Beardsley

(57) ABSTRACT

The present application provides an array substrate and a fabrication method thereof, and a display device. By etching a second insulating layer using a patterned black negative-type photoresist layer as an etching barrier layer, a second conductive member for transmitting electrical signals and having a same layer as source/drain electrodes is exposed. The second conductive member replaces an indium tin oxide in conventional technology to electrically connect a driving chip, thereby reducing processes of forming indium tin oxide and use of a photomask, simplifying production process, saving production costs, and improving production efficiency.

15 Claims, 5 Drawing Sheets

(51) Int. Cl.
  *H10D 86/01*      (2025.01)
  *H10D 86/40*      (2025.01)
(58) Field of Classification Search
  CPC .......... H01L 29/78669; H01L 27/1248; H10D
      86/60; H10D 86/0231; H10D 86/441;
                    H10D 86/451
  See application file for complete search history.

(56) References Cited

U.S. PATENT DOCUMENTS

| | | | |
|---|---|---|---|
| 6,531,392 B2 * | 3/2003 | Song ..................... | G02F 1/1362 257/E21.414 |
| 2008/0135845 A1 * | 6/2008 | Heo ..................... | H10D 86/441 257/E27.113 |
| 2021/0359182 A1 * | 11/2021 | Cao ..................... | H10H 20/857 |

* cited by examiner

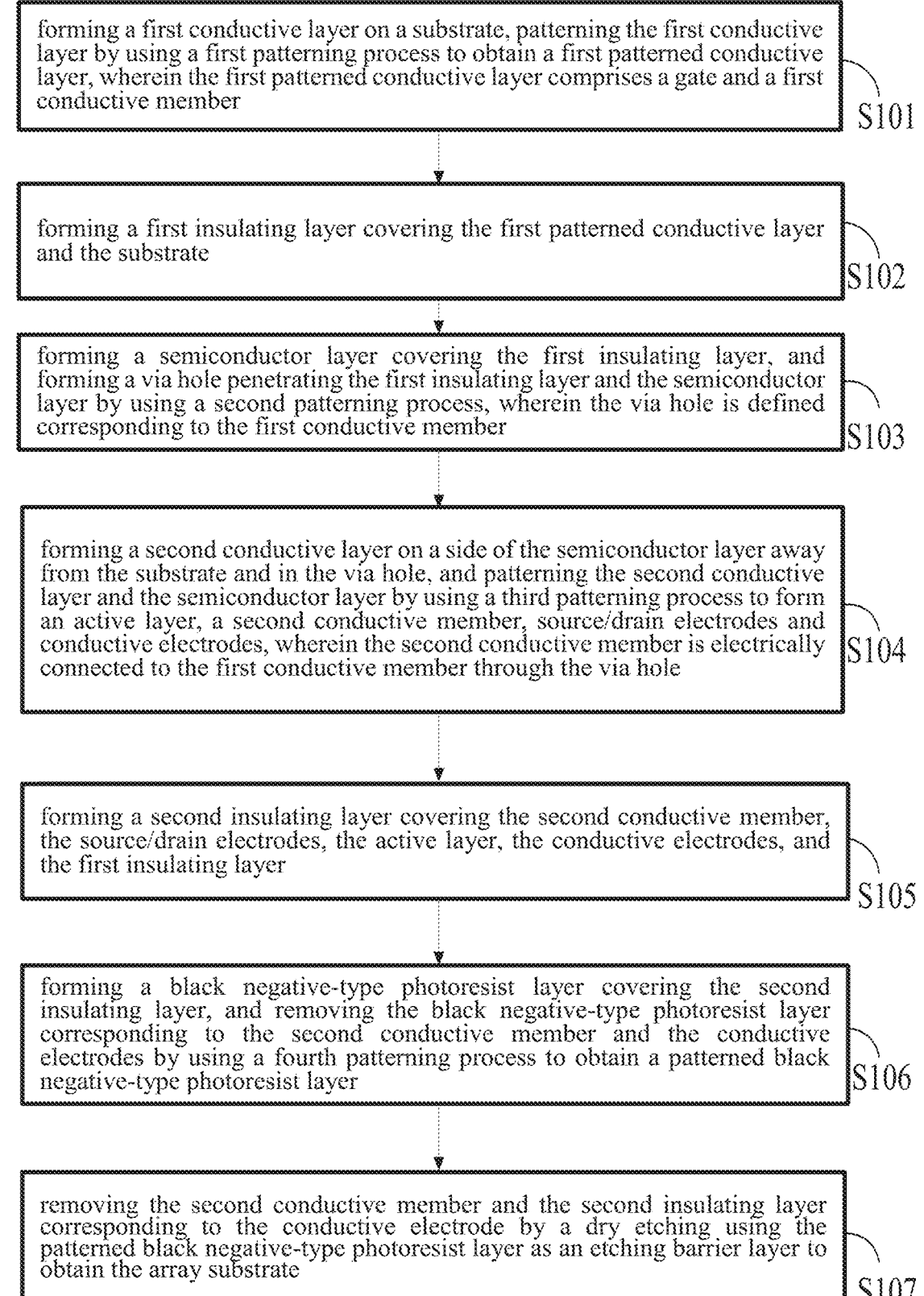

forming a first conductive layer on a substrate, patterning the first conductive layer by using a first patterning process to obtain a first patterned conductive layer, wherein the first patterned conductive layer comprises a gate and a first conductive member    S101 forming a first insulating layer covering the first patterned conductive layer and the substrate    S102 forming a semiconductor layer covering the first insulating layer, and forming a via hole penetrating the first insulating layer and the semiconductor layer by using a second patterning process, wherein the via hole is defined corresponding to the first conductive member    S103 forming a second conductive layer on a side of the semiconductor layer away from the substrate and in the via hole, and patterning the second conductive layer and the semiconductor layer by using a third patterning process to form an active layer, a second conductive member, source/drain electrodes and conductive electrodes, wherein the second conductive member is electrically connected to the first conductive member through the via hole    S104 forming a second insulating layer covering the second conductive member, the source/drain electrodes, the active layer, the conductive electrodes, and the first insulating layer    S105 forming a black negative-type photoresist layer covering the second insulating layer, and removing the black negative-type photoresist layer corresponding to the second conductive member and the conductive electrodes by using a fourth patterning process to obtain a patterned black negative-type photoresist layer    S106 removing the second conductive member and the second insulating layer corresponding to the conductive electrode by a dry etching using the patterned black negative-type photoresist layer as an etching barrier layer to obtain the array substrate    S107

ARRAY SUBSTRATE AND FABRICATION METHOD THEREOF, AND DISPLAY DEVICE

RELATED APPLICATIONS

This application is a National Phase of PCT Patent Application No. PCT/CN2020/090401 having International filing date of May 15, 2020, which claims the benefit of priority of Chinese Patent Application No. 202010329059.0 filed on Apr. 23, 2020. The contents of the above applications are all incorporated by reference as if fully set forth herein in their entirety.

FIELD AND BACKGROUND OF THE INVENTION

The present application relates to a field of display technology, and more particularly to an array substrate and a fabrication method thereof, and a display device.

Development of miniaturized light-emitting diodes has become one of the hotspots of future display technologies. Compared with current liquid crystal display (LCD) and organic light-emitting diode (OLED) display devices, miniaturized light-emitting diodes have advantages such as fast response times, high color gamut, high PPI, low energy consumption, etc., but also have a lot of technical difficulties and technical complexity, especially their key technology of mass transfer technology, and LED particle miniaturization has become a technical bottleneck. Sub-millimeter light-emitting diodes (mini-LED) function as a product of combination of miniaturized light-emitting diodes and backplates, and have characteristics of high contrast and high color rendering performance comparable to organic light-emitting diodes, with a cost that is only about 60% of organic light-emitting diodes, making them easier to implement than organic light-emitting diodes. Therefore, sub-millimeter light-emitting diodes have become a hot spot for layouts of major panel manufacturers.

As shown in FIG. 1, it is a schematic diagram of a conventional sub-millimeter light-emitting diode (mini-LED) backlight module. A conventional sub-millimeter LED backlight module comprises a substrate 200; a gate 2011 and a first conductive member 2012 formed on the substrate 200; a gate insulating layer 202 covering the substrate 200, the gate 2011, and the first conductive member 2012; an active layer 203 disposed on the gate insulating layer 202 and corresponding to the gate 2011; source/drain electrodes (2041, 2042) formed on the active layer 203 and the conductive electrode 2043 on the gate insulating layer 202; an interlayer insulating layer 205 covering the source and drain electrodes (2041, 2042) and the gate insulating layer 202 and exposing the conductive electrode 2043; an indium tin oxide layer 206 formed on the interlayer insulating layer 205 and passing through via holes on the interlayer insulating layer 205 and the gate insulating layer 202 to electrically connect the first conductive member 2012; and a light shielding layer 207 formed on the interlayer insulating layer 205. The conventional sub-millimeter light-emitting diode backlight module has disadvantages of numerous manufacturing processes.

Therefore, it is necessary to propose a technical solution to solve the problem that the conventional sub-millimeter light-emitting diodes have many manufacturing processes.

SUMMARY OF THE INVENTION

The purpose of this application is to provide an array substrate and a fabrication method thereof, and a display device, so as to simplify production processes of the array substrate and the display device.

To achieve the above objective, the present application provides a fabrication method of an array substrate, comprising following steps:

forming a first conductive layer on the substrate, patterning the first conductive layer by using a first patterning process to obtain a first patterned conductive layer, wherein the first patterned conductive layer comprises a gate and a first conductive member;

forming a first insulating layer covering the first patterned conductive layer and the substrate;

forming a semiconductor layer covering the first insulating layer, and forming a via hole penetrating the first insulating layer and the semiconductor layer by using a second patterning process, wherein the via hole is defined corresponding to the first conductive member;

forming a second conductive layer on a side of the semiconductor layer away from the substrate and in the via hole, and patterning the second conductive layer and the semiconductor layer by using a third patterning process to form an active layer, a second conductive member, source/drain electrodes and conductive electrodes, wherein the second conductive member is electrically connected to the first conductive member through the via hole;

forming a second insulating layer covering the second conductive member, the source/drain electrodes, the active layer, the conductive electrodes, and the first insulating layer;

forming a black negative-type photoresist layer covering the second insulating layer, and removing the black negative-type photoresist layer corresponding to the second conductive member and the conductive electrode by using a fourth patterning process to obtain a patterned black negative-type photoresist layer; and removing the second conductive member and the second insulating layer corresponding to the conductive electrode by a dry etching using the patterned black negative-type photoresist layer as an etching barrier layer to obtain the array substrate.

In the above fabrication method of an array substrate, the second insulating layer is a silicon nitride layer.

In the above fabrication method of an array substrate, the black negative-type photoresist layer has a thickness of 0.5 μm to 200 μm, and a thickness of the second insulating layer is 600 angstroms to 2000 angstroms.

In the above fabrication method of an array substrate, removing the second conductive member and the second insulating layer corresponding to the conductive electrode by using the dry etching comprises following steps:

using the dry etching to etch away the second conductive member and the second insulating layer corresponding to the conductive electrode at an etching rate of 10,000 angstroms/min to 10500 angstroms/min.

In the above fabrication method of an array substrate, the second conductive layer comprises a first sub-conductive layer, a second sub-conductive layer and a third sub-conductive layer, and the second sub-conductive layer is located between the first sub-conductive layer and the third sub-conductive layer, and the first sub-conductive layer is close to the substrate, and the third sub-conductive layer is far from the substrate.

In the above fabrication method of an array substrate, materials for forming the third sub-conductive layer and the first sub-conductive layer are a MoTiNi alloy or a MoNbTa alloy, and a material for forming the second sub-conductive layer is copper.

In the above fabrication method of an array substrate, the fabrication method further comprises following steps:

connecting a sub-millimeter light emitting diode to the conductive electrodes, and bonding a flip chip to the second conductive member.

An array substrate, comprising:

a substrate;

a first patterned conductive layer formed on the substrate, wherein the first patterned conductive layer comprises a gate and a first conductive member;

a first insulating layer covering the first patterned conductive layer and the substrate;

a patterned semiconductor layer formed on a side of the first insulating layer away from the substrate, wherein the patterned semiconductor layer comprises an active layer;

a second patterned conductive layer formed on a side of the patterned semiconductor layer away from the substrate, wherein the second patterned conductive layer comprises a second conductive member, source/drain electrodes, and a conductive electrode, wherein the second conductive member is electrically connected to the first conductive member through the first insulating layer and the via hole connected to the patterned semiconductor layer;

a second insulating layer covering the first insulating layer, the source/drain electrodes, the active layer and exposing the second conductive member and the conductive electrodes; and a patterned black negative-type photoresist layer formed on the second insulating layer and exposing the second conductive member and the conductive electrodes.

In the above array substrate, the second insulating layer is a silicon nitride layer.

In the above array substrate, the second patterned conductive layer comprises a first sub-patterned conductive layer, a second sub-patterned conductive layer, and a third sub-patterned conductive layer, and the second sub-patterned conductive layer is located between the first sub-patterned conductive layer and the third sub-patterned conductive layer, and the first sub-patterned conductive layer is close to the substrate, and the third sub-patterned conductive layer is far away from the substrate, and the third sub-patterned conductive layer and the first sub-patterned conductive layer are made of a MoTiNi alloy or a MoNbTa alloy, and the second sub-patterned conductive layer is made of copper.

In the above array substrate, a thickness of the second insulating layer is 600 angstroms to 2000 angstroms.

A display device, comprising an array substrate, wherein the array substrate comprises:

a substrate;

a first patterned conductive layer formed on the substrate, wherein the first patterned conductive layer comprises a gate and a first conductive member;

a first insulating layer covering the first patterned conductive layer and the substrate;

a patterned semiconductor layer formed on a side of the first insulating layer away from the substrate, wherein the patterned semiconductor layer comprises an active layer;

a second patterned conductive layer formed on a side of the patterned semiconductor layer away from the substrate, wherein the second patterned conductive layer comprises a second conductive member, source/drain electrodes, and a conductive electrode, wherein the second conductive member is electrically connected to the first conductive member through the first insulating layer and the via hole connected to the patterned semiconductor layer;

a second insulating layer covering the first insulating layer, the source/drain electrodes, the active layer and exposing the second conductive member and the conductive electrodes; and a patterned black negative-type photoresist layer formed on the second insulating layer and exposing the second conductive member and the conductive electrodes.

In the above display device, the second insulating layer is a silicon nitride layer.

In the above display device, the second patterned conductive layer comprises a first sub-patterned conductive layer, a second sub-patterned conductive layer, and a third sub-patterned conductive layer, and the second sub-patterned conductive layer is located between the first sub-patterned conductive layer and the third sub-patterned conductive layer, and the first sub-patterned conductive layer is close to the substrate, and the third sub-patterned conductive layer is far away from the substrate, and the third sub-patterned conductive layer and the first sub-patterned conductive layer are made of a MoTiNi alloy or a MoNbTa alloy, and the second sub-patterned conductive layer is made of copper.

In the above display device, a thickness of the second insulating layer is 600 angstroms to 2000 angstroms.

The present application provides an array substrate and a fabrication method thereof, and a display device. By etching a second insulating layer using a patterned black negative-type photoresist layer as an etching barrier layer, a second conductive member for transmitting electrical signals and having the same layer as source/drain electrodes is exposed. The second conductive member replaces an indium tin oxide in conventional technology to electrically connect a driving chip, thereby reducing processes of forming indium tin oxide and use of a photomask, simplifying the production process, saving production costs, and improving production efficiency. In addition, it has been verified by experiments that the patterned black negative-type photoresist layer as the etch barrier layer during dry etching process to the second insulating layer will not cause contamination to an etching equipment, and no deformation will occur to the patterned black negative-type photoresist layer after the second insulating layer is etched.

Further, a thickness of the black negative-type photoresist layer and a thickness of the second insulating layer are optimized to ensure an effective thickness of the black negative-type photoresist layer after dry etching of the second insulating layer.

Further, materials and compositions of the second conductive layer are optimized to improve oxidation resistance and conductivity of the second conductive member and the conductive electrode, and to prevent oxidation of the second conductive member and the conductive electrode in a baking process of the black negative-type photoresist layer. An indium tin is welded to the conductive electrode, and the conductivity of the second conductive layer is better than that of indium tin oxide, which is beneficial for reducing an impedance of the second conductive member and improving the signal transmission capacity.

BRIEF DESCRIPTION OF THE SEVERAL VIEWS OF THE DRAWINGS

To detailly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

FIG. 2 is a flowchart of a fabrication method of an array substrate according to an embodiment of this application.

DESCRIPTION OF SPECIFIC EMBODIMENTS OF THE INVENTION

The technical solutions in the embodiments of the present application will be described clearly and completely with reference to the drawings in the embodiments of the present application. Obviously, the described embodiments are only a part of the embodiments of the present application, but not all the embodiments. Based on the embodiments in the present application, all other embodiments obtained by those skilled in the art without making creative work fall within the protection scope of the present application.

Please refer to FIG. 2, which is a flowchart of a fabrication method of an array substrate according to an embodiment of the present application. The fabrication method of the array substrate comprises following steps:

S101: forming a first conductive layer on the substrate, patterning the first conductive layer by using a first patterning process to obtain a first patterned conductive layer, wherein the first patterned conductive layer comprises a gate and a first conductive member.

Figure 1:
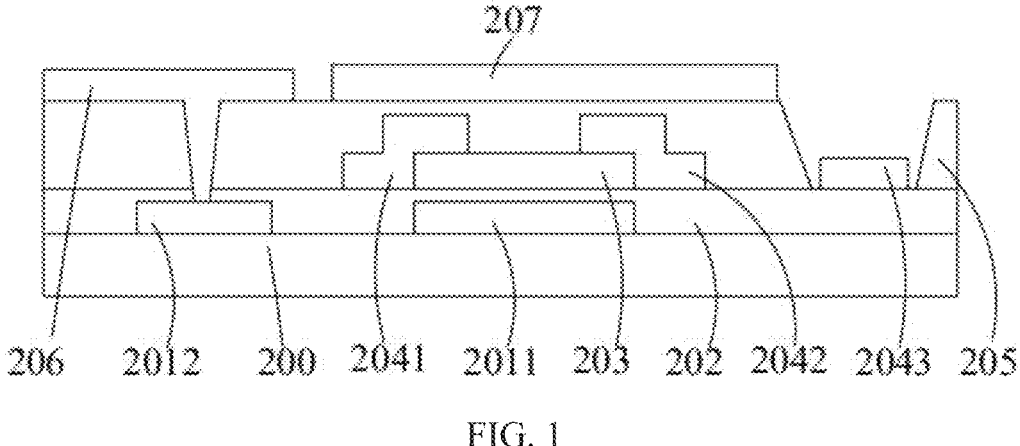
FIG. 1 is a schematic diagram of a conventional sub-millimeter LED backlight module.
Figure 3A:
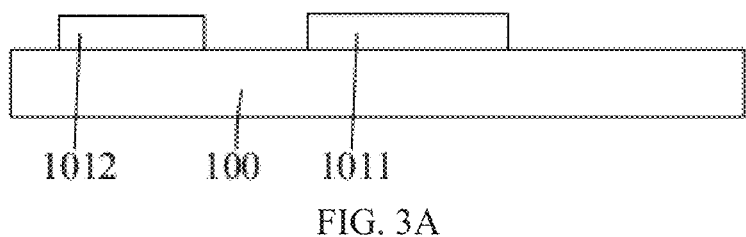
FIGS. 3A, 3B, 3C, 3D, 3E, 3F and 3G are schematic diagrams showing fabrications of an array substrate according to the flowchart shown in FIG. 2.

Specifically, a full-surface first conductive layer is formed on the substrate 100, and a full-surface photoresist is coated on the first conductive layer. After the photoresist is exposed by a first photomask and developed by a developing solution, the first conductive layer not covered by the photoresist is removed by wet etching, and the remaining photoresist is removed to obtain a first patterned conductive layer. The first patterned conductive layer comprises a gate electrode 1011 and a first conductive member 1012, as shown in FIG. 3A. The first conductive layer comprises a molybdenum layer and a copper layer disposed on the substrate 100 in sequence.

S102: forming a first insulating layer covering the first patterned conductive layer and the substrate.

Figure 3B:
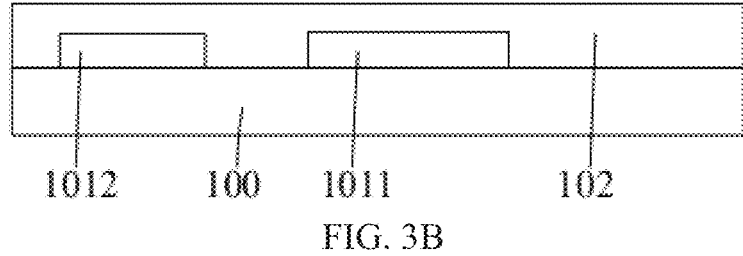

Specifically, a first insulating layer 102 covering the first patterned conductive layer and the substrate 100 is formed by using chemical vapor deposition, as shown in FIG. 3B. The first insulating layer 102 is a gate insulating layer. The preparation material of the first insulating layer 102 is at least one of silicon oxide or silicon nitride. A thickness of the first insulating layer 102 is 1000 angstroms to 15000 angstroms, for example, 1500 angstroms, 2000 angstroms, 3000 angstroms, and 5000 angstroms, so as to protect the electrical insulation of the device.

S103: forming a semiconductor layer covering the first insulating layer, and forming a via hole penetrating the first insulating layer and the semiconductor layer by using a second patterning process, wherein the via hole is defined corresponding to the first conductive member.

Figure 3C:
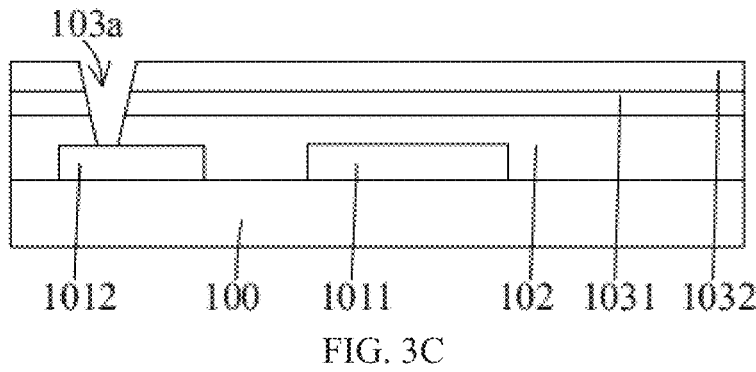

Specifically, an amorphous silicon layer 1031 covering the first insulating layer 102 and an n-type doped amorphous silicon layer 1032 are sequentially formed, and an entire-surface of photoresist is formed on the n-type doped amorphous silicon layer 1032. The photoresist is exposed by a second photomask and developed by a developing solution, and the semiconductor layer and the first insulating layer 102 are dry etched to form a via hole 103a penetrating the first insulating layer 102 and the semiconductor layer. The via hole 103a is provided corresponding to the first conductive member 1012, such as that shown in FIG. 3C. A size of the via hole 103a is 3 μm to 30 μm, which is beneficial for connection between the second conductive member formed later and the first conductive member 1012 through the via hole 103a. The size of the via hole 103a can be, for example, 5 μm, 10 μm, 15 μm, 20 μm, and 30 μm.

S104: forming a second conductive layer on a side of the semiconductor layer away from the substrate and in the via hole, and patterning the second conductive layer and the semiconductor layer by using a third patterning process to form an active layer, a second conductive member, source/drain electrodes, and conductive electrodes, wherein the second conductive member is electrically connected to the first conductive member through the via hole.

Figure 3D:
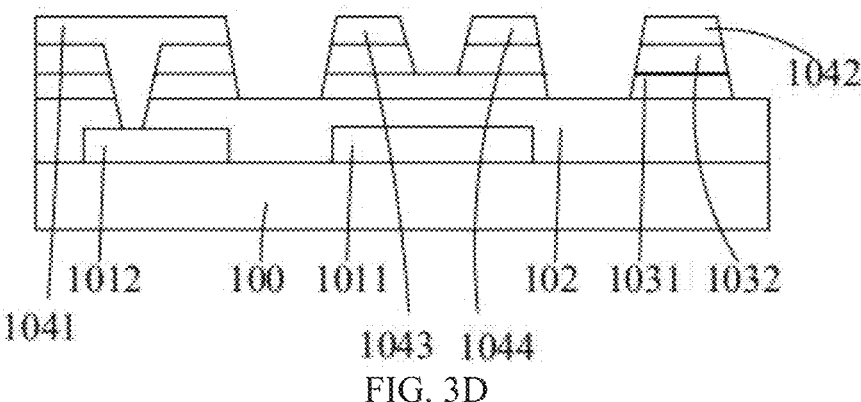

A full-surface second conductive layer is formed on the n-type doped amorphous silicon layer 1032, and a photoresist is formed on the surface of the second conductive layer. The photoresist is exposed by using a halftone gray-scale reticle to define full-reserved photoresist areas, half-reserved photoresist areas, and photoresist removal areas. One fully-reserved photoresist area corresponds to the first conductive member 1012 to facilitate subsequent patterning of the second conductive layer to form a second conductive member 1041, and one fully reserved photoresist area corresponds to an area of a conductive electrode subsequently formed for bonding sub-millimeter light-emitting diodes. One half-reserved photoresist area corresponds to a part of the gate 1011 to facilitate the subsequent formation of source/drain electrodes (1043, 1044). The photoresist removal area is located between the half-reserved photoresist area and the photoresist completely reserved area. The photoresist in the photoresist removal area is removed, and the second conductive layer in the photoresist removal area is etched by wet etching, and then the n-type doped amorphous silicon layer 1032 and amorphous silicon layer 1031 in the photoresist removal area is removed by dry etching to form a second conductive member 1041 and a conductive electrode 1042. Next, the photoresist in the photoresist half-reserved area is removed, and the second conductive layer in the photoresist half-reserved area is removed by using wet etching, and then the n-type doped amorphous silicon layer in the photoresist half-reserved area is removed by dry etching to form source/drain electrodes (1043, 1044) and an active layer, as shown in FIG. 3D.

The second conductive layer comprises a first sub-conductive layer, a second sub-conductive layer, and a third sub-conductive layer, and the second sub-conductive layer is located between the first sub-conductive layer and the third sub-conductive layer. The first sub-conductive layer is close to the substrate 100, and the third sub-conductive layer is far away from the substrate 100. The preparation material of the third sub-conductive layer and the first sub-conductive layer is selected from any one of MoTiNi alloy, MoNbTa alloy, Mo, Ti, and Ni, and the preparation material of the second sub-conductive layer is copper or copper alloy. MoTiNi alloy, MoNbTa alloy, Mo, Ti, and Ni all have good oxidation resistance, and can prevent oxidation of the second conductive member 1041 and the conductive electrode 1042. The second sub-conductive layer is copper or copper alloy, which improves a conductivity of the second conductive member 1041 and the conductive electrode 1042. The second conductive member 1041 is made of metal, and a conductivity of the metal is better than that of the indium tin oxide, which improves the conductivity of the second conductive member 1041. The second conductive member 1041 is arranged in the same layer as the source/drain electrodes (1043, 1044) to bind a flip chip film.

The preparation material of the first sub-conductive layer is MoTiNi alloy or MoNbTa alloy, on the one hand, it can prevent the oxidation of the second sub-conductive layer, on the other hand, it can prevent the second sub-conductive layer from diffusing, or the preparation of the first sub-conductive layer is Mo to better prevent the diffusion of the second sub-conductive layer. The preparation material of the third sub-conductive layer is MoTiNi alloy or MoNbTa alloy to prevent oxidation of the second sub-conductive layer. The second sub-conductive layer is made of copper. A thickness of the first sub-conductive layer is 50 angstroms to 1000 angstroms, such as 200 angstroms, 400 angstroms, 600 angstroms, and 800 angstroms. A thickness of the third sub-conductive layer is 50 angstroms to 1000 angstroms, such as 200 angstroms, 400 angstroms, 600 angstroms and 800 angstroms. A thickness of the second sub-conductive layer is 4000 angstroms to 6000 angstroms, for example 4500 angstroms. Thicknesses of the first sub-conductive layer, the second sub-conductive layer, and the third sub-conductive layer are selected to satisfy the requirement of good fusion between the conductive electrode 1042 and the solder paste.

S105: forming a second insulating layer covering the second conductive member, the source/drain electrodes, the active layer, the conductive electrodes, and the first insulating layer.

Figure 3E:
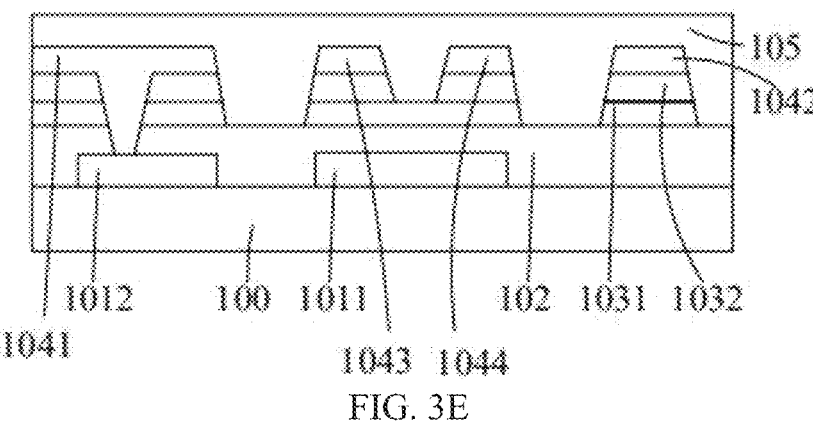

A second insulating layer 105 covering the second conductive member 1041, the source/drain electrodes (1043, 1044), the conductive electrode 1042, and the first insulating layer 102 is formed by chemical vapor deposition, as shown in FIG. 3E. The second insulating layer 105 is made of silicon nitride. A thickness of the second insulating layer is 600 angstroms to 2000 angstroms, for example, 800 angstroms, 1000 angstroms, 1500 angstroms, and 1700 angstroms. On one hand, it allows electrical insulation of the second insulating layer is 600, and on the other hand, it prevents failure of the patterned black negative-type photoresist layer due to subsequent etching of the second insulating layer 105 having an excessive thickness.

S106: forming a black negative-type photoresist layer covering the second insulating layer, and removing the black negative-type photoresist layer corresponding to the second conductive member and the conductive electrode by using a fourth patterning process to obtain a patterned black negative-type photoresist layer.

Figure 3F:
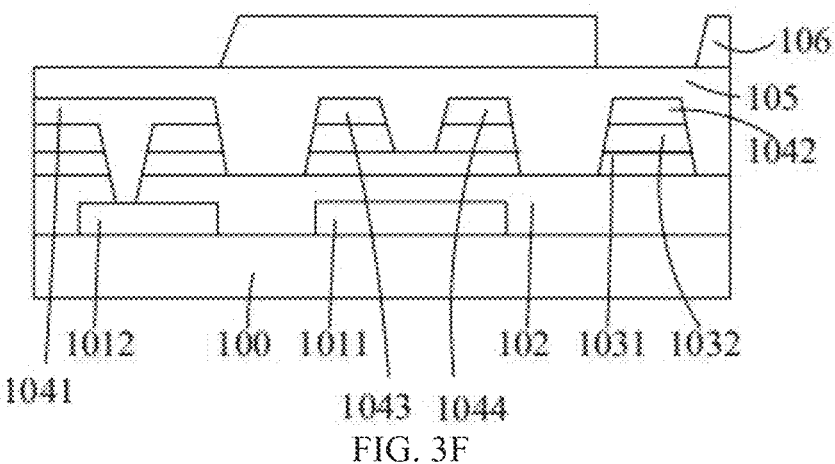

A black negative-type photoresist layer 106 is coated on the entire surface of the second insulating layer 105. A thickness of the black negative photoresist layer is 0.5 μm to 200 μm. Compared with conventional photoresist, the black negative-type photoresist has better corrosion resistance and stability after exposure, so as to prevent the performance of the black negative-type photoresist from being significantly damaged during the dry etching process of the second insulating layer. A fourth photomask is used to expose the black negative-type photoresist layer, and a developer is used to etch the unexposed portion of the black negative photoresist layer to obtain a patterned black negative photoresist layer, as shown in FIG. 3F.

S107: removing the second conductive member and the second insulating layer corresponding to the conductive electrode by a dry etching using the patterned black negative-type photoresist layer as an etching barrier layer to obtain the array substrate.

Figure 3G:
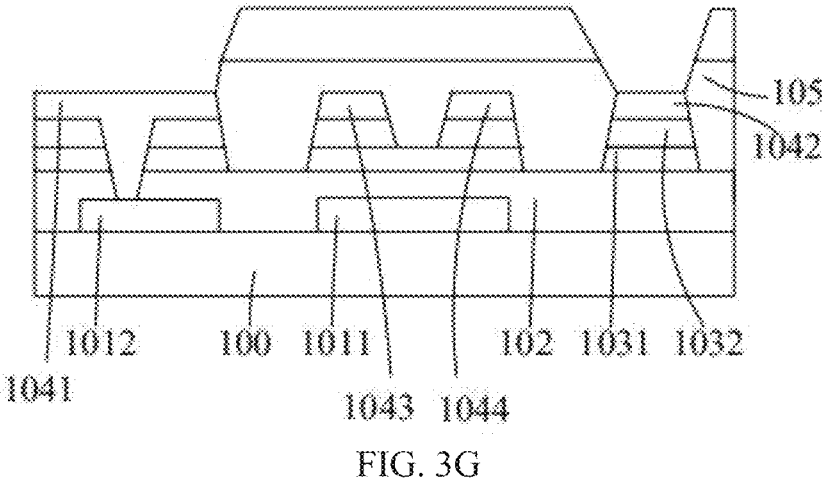

The patterned black negative-type photoresist is used as an etching barrier layer, and the second insulating layer is etched using common etching gases. For example, the etching gases comprise nitrogen trifluoride, oxygen, and helium, and dry etching is performed at 10,000 angstroms/min to 10500 angstroms/min to remove the second insulating layer corresponding to the second conductive member and the conductive electrode to expose the second conductive member and the conductive electrode, as shown in FIG. 3G. A sub-millimeter light-emitting diode (not shown) is connected to the conductive electrode 1042, and a flip-chip film (not shown) is bound to the second conductive member 1041.

Experiments of feasibility result of patterning black negative-type photoresist (BM) as an etching barrier are shown as below.

Feasibility results of loss of the patterned black negative-type photoresist are shown in Table 1.

TABLE 1

| | Average thickness of BM before etching (μm) | Average thickness of BM after etching (μm) | Etched thickness of second insulating layer (angstroms) | Average thickness reduction of BM after etching (angstroms) | BM loss after etching 1000 angstroms of second insulating layer (angstroms) |
|---|---|---|---|---|---|
| feasibility results of loss of the patterned black negative-type photoresist | | | | | |
| Exp. 1 | 1.23 | 1.06 | 1700 | 270 | 200 |
| Exp. 2 | 1.23 | 1.15 | 800 | 127 | angstroms |

As show in Table 1, 200 angstroms of the patterned black negative-type photoresist will be lost when every 1000 angstroms of silicon nitride layer are etched. The thickness of the second insulating layer is 600 angstroms to 2000 angstroms, and the thickness of the black negative-type photoresist is 0.5 μm to 200 μm, which will not cause the patterned black negative-type photoresist to fail due to the failure after the etching of the second insulating layer. The patterned black negative-type photoresist meets the requirements. Especially when the thickness of the black negative-type photoresist is 1 μm to 1.5 μm, for example 1.23 μm, since the amount of black negative-type photoresist layer lost due to the dry etching of the second insulating layer is relatively small, it will not affect shading of the patterned black negative-type photoresist.

It should be noted that Experiment 1 and Experiment 2 are an average thickness of five points of BM before and after etching.

Figure 4:
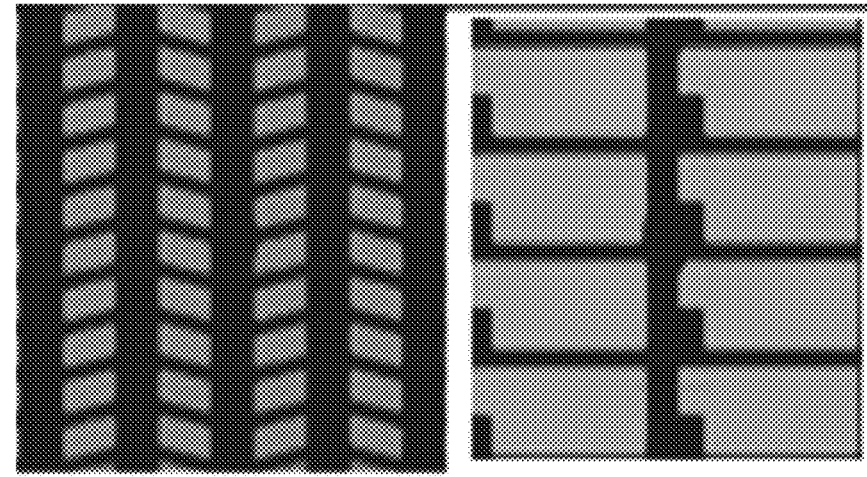
FIG. 4 is a schematic diagram of a patterned black negative-type photoresist layer after a second insulating layer is dry etched.

The normal pattern verification of the patterned black negative-type photoresist is shown in FIG. 4, which is a schematic diagram of the patterned black negative-type photoresist layer after the second insulating layer is dry etched. The pattern of the patterned black negative-type photoresist did not appear abnormal after being etched by the second insulating layer, indicating that the dry etching process of silicon nitride will not cause damage to the patterned black negative-type photoresist pattern.

In addition, the inventors also verified through experiments that the patterned black negative-type photoresist does not contaminate the dry etching equipment during the second insulating layer etching process, so it is feasible to use the patterned black negative-type photoresist as an etching barrier in the dry etching process, and the slope on the second insulating layer after the second insulating layer is etched at an etching rate of 10,000 angstroms/min to 10500 angstroms/min meets the requirements.

The present application further provides a backlight module, and the backlight module comprises an array substrate, and the array substrate comprises:

a substrate;

a first patterned conductive layer formed on the substrate, wherein the first patterned conductive layer comprises a gate and a first conductive member;

a first insulating layer covering the first patterned conductive layer and the substrate;

a patterned semiconductor layer formed on a side of the first insulating layer away from the substrate, wherein the patterned semiconductor layer comprises an active layer;

a second patterned conductive layer formed on a side of the patterned semiconductor layer away from the substrate, wherein the second patterned conductive layer comprises a second conductive member, source/drain electrodes, and a conductive electrode, wherein the second conductive member is electrically connected to the first conductive member through the first insulating layer and a via hole connected to the patterned semiconductor layer;

a second insulating layer covering the first insulating layer, the source/drain electrodes, and the active layer, and exposing the second conductive members and the conductive electrodes; and a patterned black negative-type photoresist layer formed on the second insulating layer and exposing the second conductive member and the conductive electrodes.

In this embodiment, the second insulating layer is a silicon nitride layer.

In this embodiment, the second patterned conductive layer comprises a first sub-patterned conductive layer, a second sub-patterned conductive layer, and a third sub-patterned conductive layer, the second sub-patterned conductive layer is located between the first sub-patterned conductive layer and the third sub-patterned conductive layer, the first sub-patterned conductive layer is close to the substrate, the third sub-patterned conductive layer is far away from the substrate, the third sub-patterned conductive layer and the first sub-patterned conductive layer are made of a MoTiNi alloy or a MoNbTa alloy, and the second sub-patterned conductive layer is made of copper.

In this embodiment, a thickness of the second insulating layer is 600 angstroms to 2000 angstroms.

In this embodiment, the sub-millimeter light-emitting diode (mini-LED) is connected to the conductive electrode through solder paste or conductive adhesive, and the flip-chip film is bonded to the second conductive member. The flip-chip film comprises a flexible film and a driving chip provided on the flexible film.

The present application also provides a display device comprising the above backlight module.

The descriptions of the above embodiments are only used to help understand the technology of the present application, solutions and their core ideas; those of ordinary skill in the art should understand that they can still modify the technical solutions described in the foregoing embodiments or equivalently replace some of the technical features, and these modifications or replacements do not make the essence of the corresponding technical solutions deviate from the scope of the technical solutions of the embodiments of the present application.

What is claimed is:

1. An array substrate, comprising:

a substrate;

a first patterned conductive layer formed on the substrate, wherein the first patterned conductive layer comprises a gate and a first conductive member;

a first insulating layer covering the first patterned conductive layer and the substrate;

a patterned semiconductor layer formed on a side of the first insulating layer away from the substrate, wherein the patterned semiconductor layer comprises an active layer;

a second patterned conductive layer formed on a side of the patterned semiconductor layer away from the substrate, wherein the second patterned conductive layer comprises a second conductive member, source/drain electrodes, and a conductive electrode, wherein the second conductive member is electrically connected to the first conductive member through the first insulating layer and a via hole connected to the patterned semiconductor layer;

a second insulating layer covering the first insulating layer, the source/drain electrodes, and the active layer, and exposing the second conductive member and the conductive electrode; and a patterned black negative-type photoresist layer formed on the second insulating layer and exposing the second conductive member and the conductive electrode, wherein an orthographic projection of the patterned black negative-type photoresist layer on the substrate completely covers an orthographic projection of the source/drain electrodes on the substrate.

2. The array substrate of claim 1, wherein the second insulating layer is a silicon nitride layer.

3. The array substrate of claim 1, wherein a thickness of the second insulating layer is 600 angstroms to 2000 angstroms.

4. The array substrate of claim 1, wherein the orthographic projection of the patterned black negative-type photoresist layer on the substrate does not overlap with an orthographic projection of the second conductive member on the substrate and an orthographic projection of the conductive electrode on the substrate.

5. The array substrate of claim 1, wherein the second patterned conductive layer comprises a first sub-patterned conductive layer, a second sub-patterned conductive layer, and a third sub-patterned conductive layer, the second sub-patterned conductive layer is located between the first sub-patterned conductive layer and the third sub-patterned conductive layer, the first sub-patterned conductive layer is close to the substrate, the third sub-patterned conductive layer is away from the substrate, the third sub-patterned conductive layer and the first sub-patterned conductive layer are made of a MoTiNi alloy or a MoNbTa alloy, and the second sub-patterned conductive layer is made of copper.

6. The array substrate of claim 1, wherein an orthographic projection of the second insulating layer on the substrate does not overlap with an orthographic projection of a surface on a side of the second conductive member away from the substrate on the substrate.

7. A display device, comprising an array substrate, wherein the array substrate comprises:

a substrate;

a first patterned conductive layer formed on the substrate, wherein the first patterned conductive layer comprises a gate and a first conductive member;

a first insulating layer covering the first patterned conductive layer and the substrate;

a patterned semiconductor layer formed on a side of the first insulating layer away from the substrate, wherein the patterned semiconductor layer comprises an active layer;

a second patterned conductive layer formed on a side of the patterned semiconductor layer away from the substrate, wherein the second patterned conductive layer comprises a second conductive member, source/drain electrodes, and a conductive electrode, wherein the second conductive member is electrically connected to the first conductive member through the first insulating layer and a via hole connected to the patterned semiconductor layer;

a second insulating layer covering the first insulating layer, the source/drain electrodes, and the active layer, and exposing the second conductive members and the conductive electrode; and a patterned black negative-type photoresist layer formed on the second insulating layer and exposing the second conductive member and the conductive electrode;

wherein an orthographic projection of the patterned black negative-type photoresist layer on the substrate completely covers an orthographic projection of the source/drain electrodes on the substrate.

8. The display device of claim 7, wherein the second insulating layer is a silicon nitride layer.

9. The display device of claim 7, wherein a thickness of the second insulating layer is 600 angstroms to 2000 angstroms.

10. The array substrate of claim 5, wherein an orthographic projection of the first sub-patterned conductive layer on the substrate, an orthographic projection of the second sub-patterned conductive layer on the substrate, and an orthographic projection of the third sub-patterned conductive layer on the substrate cover an orthographic projection of the via hole on the substrate, respectively.

11. A fabrication method of an array substrate, comprising following steps:

forming a first conductive layer on a substrate, patterning the first conductive layer by using a first patterning process to obtain a first patterned conductive layer, wherein the first patterned conductive layer comprises a gate and a first conductive member;

forming a first insulating layer covering the first patterned conductive layer and the substrate;

forming a semiconductor layer covering the first insulating layer, and forming a via hole penetrating the first insulating layer and the semiconductor layer by using a second patterning process, wherein the via hole is defined corresponding to the first conductive member;

forming a second conductive layer on a side of the semiconductor layer away from the substrate and in the via hole, and patterning the second conductive layer and the semiconductor layer by using a third patterning process to form an active layer, a second conductive member, source/drain electrodes, and a conductive electrode, wherein the second conductive member is electrically connected to the first conductive member through the via hole;

forming a second insulating layer covering the second conductive member, the source/drain electrodes, the active layer, the conductive electrode, and the first insulating layer;

forming a black negative-type photoresist layer covering the second insulating layer, and removing the black negative-type photoresist layer corresponding to the second conductive member and the conductive electrode by using a fourth patterning process to obtain a patterned black negative-type photoresist layer; and removing the second conductive member and the second insulating layer corresponding to the conductive electrode by dry etching using the patterned black negative-type photoresist layer as an etching barrier layer to obtain the array substrate;

wherein an orthographic projection of the patterned black negative-type photoresist layer on the substrate completely covers an orthographic projection of the source/drain electrodes on the substrate.

12. The fabrication method of the array substrate according to claim 11, wherein the second insulating layer is a silicon nitride layer.

13. The fabrication method of the array substrate according to claim 11, wherein the black negative-type photoresist layer has a thickness of 0.5 μm to 200 μm, and a thickness of the second insulating layer is 600 angstroms to 2000 angstroms.

14. The fabrication method of the array substrate according to claim 11, wherein removing the second conductive member and the second insulating layer corresponding to the conductive electrode by using the dry etching comprises following step:

using the dry etching to etch away the second conductive member and the second insulating layer corresponding to the conductive electrode at an etching rate of 10,000 angstroms/min to 10500 angstroms/min.

15. The fabrication method of the array substrate according to claim 14, wherein preparation materials of the third sub-conductive layer and the first sub-conductive layer are a MoTiNi alloy or a MoNbTa alloy, and a preparation material of the second sub-conductive layer is copper.

* * * * *